United States Patent
Kadota et al.

(10) Patent No.: US 6,313,563 B1
(45) Date of Patent: Nov. 6, 2001

(54) EDGE REFLECTION TYPE SURFACE ACOUSTIC WAVE DEVICE

(75) Inventors: Michio Kadota, Kyoto; Hiroshi Kawai, Yokohama; Junya Ago, Nagaokakyo; Hideya Horiuchi, Kyoto; Yasuhiro Negoro, Nagaokakyo, all of (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/537,908

(22) Filed: Mar. 28, 2000

(30) Foreign Application Priority Data

Apr. 7, 1999 (JP) ................................. 11-100621

(51) Int. Cl.$^7$ ........................................... H03H 9/25
(52) U.S. Cl. ................................. 310/313 R; 310/313 B
(58) Field of Search .......................... 310/313 B, 313 R

(56) References Cited

U.S. PATENT DOCUMENTS

| 5,389,806 | * | 2/1995 | Hickernell et al. ........... 257/239 |
| 5,463,901 | * | 11/1995 | Hachigo et al. ............... 73/753 |
| 5,952,899 | * | 9/1999 | Kadota et al. ................ 310/313 B |
| 5,977,686 | * | 11/1999 | Kadota et al. ................ 30/313 B |
| 5,986,523 | * | 11/1999 | Morizumi et al. ............ 310/313 B |
| 6,127,769 | * | 10/2000 | Kadota et al. ................ 310/313 B |

FOREIGN PATENT DOCUMENTS

| 63-169806 | 7/1988 | (JP) | H03H/9/25 |
| 6-303073 | 10/1994 | (JP) | H03H/3/08 |
| 10-229319 | * | 8/1998 | (JP) | 310/313 R |

* cited by examiner

*Primary Examiner*—Thomas M. Dougherty
(74) *Attorney, Agent, or Firm*—Keating & Bennett, LLP

(57) ABSTRACT

An edge reflection type surface acoustic wave device includes a surface acoustic wave substrate made of a piezoelectric single crystal and having first and second opposite edges, and at least one interdigital transducer disposed on the surface acoustic wave substrate. The surface acoustic wave device is constructed such that a Shear Horizontal type surface acoustic wave is reflected between the first and second opposite edges. The surface acoustic wave substrate is made of an ion-implanted piezoelectric single crystal substrate.

19 Claims, 3 Drawing Sheets

EDGE REFLECTION TYPE SURFACE ACOUSTIC WAVE DEVICE

BACKGROUND OF THE INVENTION

1. Field of the Invention

The present invention relates to a surface acoustic wave device for use as a resonator and a band filter, and more particularly, the present invention relates to an edge reflection type surface acoustic wave device which utilizes Shear Horizontal (SH) type surface acoustic wave.

2. Description of the Related Art

Edge reflection type surface acoustic wave devices which utilize SH type surface acoustic waves such as BGS (Bleustein-Gulyaev-Shimizu wave) waves, Love waves, leaky waves and other such surface acoustic waves are known. In an edge reflection type surface acoustic wave device, a surface acoustic wave is reflected between a pair of opposite edges of a surface acoustic wave substrate. Therefore, it is not necessary to provide reflectors at both ends of the surface acoustic wave substrate or on both sides in the surface acoustic wave propagation direction of the area in which interdigital transducers are located. Accordingly, a surface acoustic wave device having a reduced size can be provided.

In an edge surface acoustic wave device including a surface acoustic wave substrate made of a piezoelectric single crystal, an unnecessary wave, such as a bulk wave or other undesirable wave, propagating from the surface of the substrate to the inner portion thereof and excited simultaneously with an SH type surface acoustic wave is reflected between the edges of the surface acoustic wave substrate and causes a large ripple to be generated in an attenuation frequency characteristic. For example, a large ripple tends to occur in the top thereof, that is, in the pass band.

SUMMARY OF THE INVENTION

In order to solve the problems described above, preferred embodiments of the present invention provide an edge reflection type surface acoustic wave device in which an SH type surface acoustic wave is utilized, and a ripple appearing in the frequency characteristic is prevented from occurring.

An edge reflection type surface acoustic wave device according to a preferred embodiment of the present invention includes a surface acoustic wave substrate made of a piezoelectric single crystal and having first and second opposite edges, and at least one interdigital transducer located on the surface acoustic wave substrate and being arranged such that a Shear Horizontal type surface acoustic wave is reflected between the first and second opposite edges, wherein the surface acoustic wave substrate is made of an ion-implanted piezoelectric single crystal substrate.

Preferably, the piezoelectric single crystal substrate is made of at least one of a 36° to 41° rotation Y plate LiTaO$_3$, a 41° rotation Y plate LiNbO$_3$, and a 64° rotation Y plate LiNbO$_3$.

As the ions to be implanted, at least one of Ar ions, N ions, Be ions, B ions, and P ions are preferably used, and more preferably, P ions are used.

A method of manufacturing an edge reflection type surface acoustic wave device according to a preferred embodiment of the present invention includes the steps of preparing a surface acoustic wave substrate made of a piezoelectric single crystal, implanting ions into the surface of the surface acoustic wave substrate, forming at least one interdigital transducer on the surface acoustic wave substrate, and cutting the surface acoustic wave substrate in the thickness direction to form first and second opposite edges.

In the method of manufacturing an edge reflection type surface acoustic wave device according to a preferred embodiment of the present invention, preferably, the piezoelectric single crystal substrate includes at least one of a 36° to 41° rotation Y plate LiTaO$_3$, a 41° rotation Y plate LiNbO$_3$, and a 64° rotation Y plate LiNbO$_3$.

Further, in the method of manufacturing an edge reflection type surface acoustic wave device according to a preferred embodiment of the present invention, preferably, as ions to be implanted, at least one of Ar ions, N ions, Be ions, B ions, and P ions are preferably used when the ion implantation is carried out.

More preferably, the above-described ion implantation is carried out under the conditions of an acceleration voltage of about 50 keV to about 150 keV and an ion implantation quantity of about $1 \times 10^4$ ions/cm$^2$ to about $1 \times 10^{16}$ ions/cm$^2$.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Figure 1:
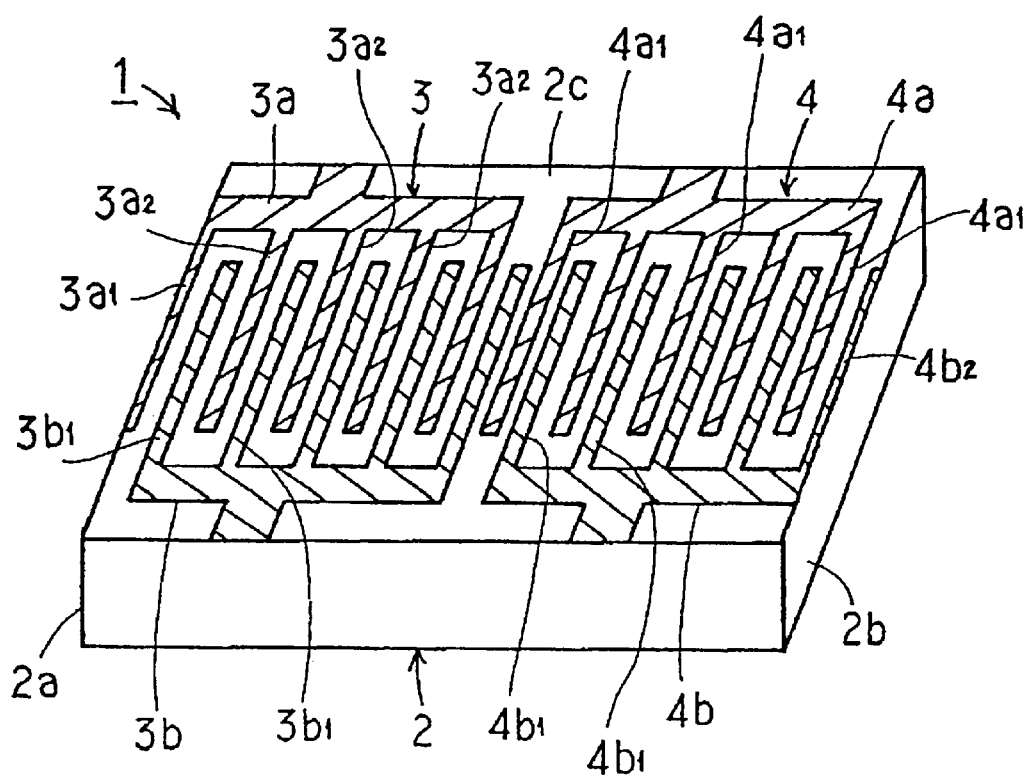
FIG. 1 is a perspective view showing an edge reflection type longitudinally coupled surface acoustic wave device according to a preferred embodiment of the present invention.

The inventors of the present invention have discovered that large ripples generated in an attenuation frequency characteristic can be successfully minimized by using a surface acoustic wave substrate in which ions are implanted at the surface region of the surface acoustic wave substrate. In addition, the inventors have discovered that the impedance ratio which is defined by the ratio of the impedances at the resonance frequency and the anti-resonance frequency (in the case of a resonator) or insertion loss (in the case of filter) are also improved by using a surface acoustic wave substrate in which ions are implanted at the surface region of the surface acoustic wave substrate.

The reasons for the suppression of ripple in an attenuation frequency characteristic is a result of the ion-implantation reducing a surface acoustic wave velocity at the surface region of the surface acoustic wave substrate, which shifts the attenuation frequency characteristic of the edge reflection type surface acoustic wave device as a whole but does not shift the frequency of the ripple, thereby successfully eliminating the ripple in the attenuation frequency characteristic. Further, it is thought that the SH wave which generally includes a bulk wave tends to be converted into a Love wave or a Love-like wave which includes only SH wave components by as a result of using the surface acoustic wave which has a ion-implanted layer provided at the surface thereof and having a surface acoustic wave velocity which is lower than the remaining region of the surface acoustic wave substrate. As a result, the bulk wave which causes the energy loss due to no contribution as a surface acoustic wave is reduced, whereby the insertion loss or the impedance ratio is greatly improved.

The ion-implantation process generally is a well known and established technique, and it is not complicated to prepare a surface acoustic wave substrate in which the surface region thereof is implanted with ions. So, it is possible to produce the edge reflection type surface acoustic wave device according to preferred embodiments of the present invention without having to use a complicated and expensive process.

It is to be noted that, in a surface acoustic wave device which utilizes a Rayleigh wave or other such surface acoustic wave, it is known that the surface acoustic velocity and the electromechanical coupling factor can be changed by use of an ion-implanted surface acoustic wave substrate by (for example, Japanese Unexamined Patent Publication Nos. 63-169806 and 6-303073). This is due to the fact that an ion implanted layer, into which ions are implanted, is provided at the surface portion of a piezoelectric single crystal substrate constituting the surface acoustic wave substrate by ion implantation. When an ion-implanted surface acoustic wave substrate is used, the surface acoustic velocity and an electromechanical coupling factor K are reduced. Thus, it is disclosed that, in the case of a ladder type filter, for example, which is formed by utilization of ion implantation, the adjustment of frequency and that of a bandwidth can be achieved.

This known technique is used to adjust frequency of the filter (for example, center frequency of pass-band or the like) using a Rayleigh wave, and therefore is quite different from the present invention.

In addition, because the Rayleigh wave cannot be reflected by edges of a surface acoustic wave substrate, the surface acoustic wave device utilizing a Rayleigh wave requires grating reflectors. In this case, the reflection of the bulk wave does not cause the ripple in the attenuation frequency characteristic of the surface acoustic wave device. Furthermore, the Rayleigh wave is not changed or converted even when an ion-implanted surface acoustic wave substrate is used.

For these reasons, it is clear that the present invention is based on the unique discovery of the inventors of the present invention and that the surface acoustic wave device according to preferred embodiments of the present invention is quite novel and useful compared to the known technique described above.

Hereinafter, various preferred embodiments of the present invention will be more specifically described with reference to specific examples in connection with the drawings.

FIG. 1 is a perspective view showing an edge reflection type surface acoustic wave device resonator filter defining a surface acoustic wave device according to an example of a preferred embodiments of the present invention.

An edge reflection type surface acoustic wave device resonator filter 1 preferably includes a surface acoustic wave substrate 2. The surface acoustic wave substrate 2 is preferably made of a piezoelectric single crystal. The piezoelectric single crystal is preferably a piezoelectric single crystal substrate suitable for excitation of an SH type surface acoustic wave. Examples of such a piezoelectric single crystal substrate, includes an $LiTaO_3$ substrate, an $LiNbO_3$ substrate, or other such substrates. Preferably, the surface acoustic wave substrate 2 is made of at least one of a 36° to 41° rotation Y plate $LiTaO_3$, a 41° rotation Y plate $LiNbO_3$, and a 64° rotation Y plate $LiNbO_3$ as a piezoelectric single crystal substrate.

The surface acoustic wave substrate 2 has a pair of opposite edges 2a and 2b. On the upper surface 2c, first and second IDTs 3 and 4 are arranged in the surface acoustic wave propagation direction, that is, in the direction passing through the edges 2a and 2b.

The IDTs 3 and 4 preferably include a pair of interdigital electrodes 3a, 3b, 4a, and 4b, respectively. The interdigital electrodes 3a to 4b have plural electrode fingers $3a_1$, $3a_2$, $3b_1$, $4a_1$, $4b_1$, and $4b_2$ elongated perpendicularly relative to the surface acoustic wave propagation direction.

In the IDT 3, the electrode fingers $3a_1$ and $3a_2$ and the plural electrode fingers $3b_1$ are arranged so as to be inserted between each other in an interdigitated manner. Similarly, in the IDT 4, the electrode finger $4a_1$, and the electrode fingers $4b_1$ and $4b_2$ are arranged so as to be inserted between each other in an interdigitated manner.

The electrode fingers $3a_1$ and $4b_2$ positioned on the both sides in the surface acoustic wave propagation direction of the electrode fingers $3a_1$ to $4b_2$ preferably have a width of about $\lambda/8$ in which $\lambda$ represents the wave length of an SH type surface acoustic wave. The remaining electrode fingers $3a_2$, $3b_1$, $4a_1$, and $4b_1$ preferably have a width of about $\lambda/4$. Further, the width of the gap between adjacent electrode fingers in the surface acoustic wave propagation direction is preferably about $\lambda/4$.

Further, the electrode fingers $3a_1$ and $4b_2$ on both sides in the surface acoustic wave propagation direction are arranged so as to elongate along the edges defined by the edges 2a, 2b and the upper surface 2c, respectively.

The above-described IDTs 3 and 4 are preferably formed by application of a metal film such as aluminum or other suitable material, and patterning the film.

In the longitudinally coupled surface acoustic wave device resonator filter 1 of this example of preferred embodiments of the present invention, when an input signal is applied to the IDTs 3 and 4, a surface acoustic wave is excited by the IDTs 3 and 4. The excited surface acoustic wave is propagated in the direction passing through the edges 2a and 2b and reflected from the edges 2a and 2b, so that zero mode and first mode vibrations are generated, and both modes are combined to generate a standing-wave. A filter characteristic is obtained from this standing-wave. Accordingly, the surface acoustic wave resonator filter 1 operates as a longitudinally coupled type resonator filter.

The characteristics of the edge reflection type surface acoustic wave device resonator filter of this preferred embodiment result from the surface acoustic wave substrate 2 including an ion-implanted piezoelectric single crystal substrate. As understood from the experimental examples described later, by using the ion-implanted piezoelectric single crystal substrate, a ripple is prevented from being produced in a pass band in the attenuation frequency characteristics. In this case, as ions to be implanted, Al ions, N ions, Be ions, B ions, and P ion can be preferably used. More preferably, P ions are used.

Hereinafter, a method of producing an edge reflection type longitudinally coupled surface acoustic wave resonator filter 1 of this preferred embodiment of a surface acoustic wave substrate 2 including an ion-implanted piezoelectric single crystal substrate, and the effects will be described by explanation of a specific example.

EXPERIMENTAL EXAMPLE 1

First, as a surface acoustic wave substrate 2, a piezoelectric single crystal substrate including a 36° rotation Y plate LiTaO$_3$ was prepared. P ions were implanted from the upper surface of the substrate under the conditions of an acceleration voltage of about 140 keV and an ion implantation quantity of about $5 \times 10^{15}$/cm$^2$. Thereafter, an Al film with a thickness of about 0.5 μm was formed on the upper side of the piezoelectric single crystal substrate, IDTs 3 and 4 were formed via patterning. Next, the piezoelectric single crystal substrate was cut in the thickness direction to define opposite edges 2a and 2b. Thus, a surface acoustic wave resonator filter 1 having approximate dimensions of 1.4×2.0×0.35 mm, that is, having a distance between the edges 2a and 2b of about 0.79 mm was obtained. This surface acoustic wave resonator filter 1 is the surface acoustic wave resonator filter of EXAMPLE 1.

For comparison, an edge reflection type longitudinally coupled surface acoustic wave resonator filter was produced in the same manner as that of the above EXAMPLE except that the above-described piezoelectric single crystal substrate not implanted with ions was used. The longitudinally coupled surface acoustic wave resonator filter prepared for comparison is a CONVENTIONAL EXAMPLE.

Further, edge reflection type longitudinal surface acoustic wave resonator filters were produced in the same manner as that of the above EXAMPLE except that Ar ions and B ions were used instead of P ions, respectively. The filter containing the piezoelectric single crystal substrate into which Ar ions were implanted is EXAMPLE 2. The filter containing the piezoelectric single crystal substrate into which B ions were implanted is EXAMPLE 3.

Figure 2:
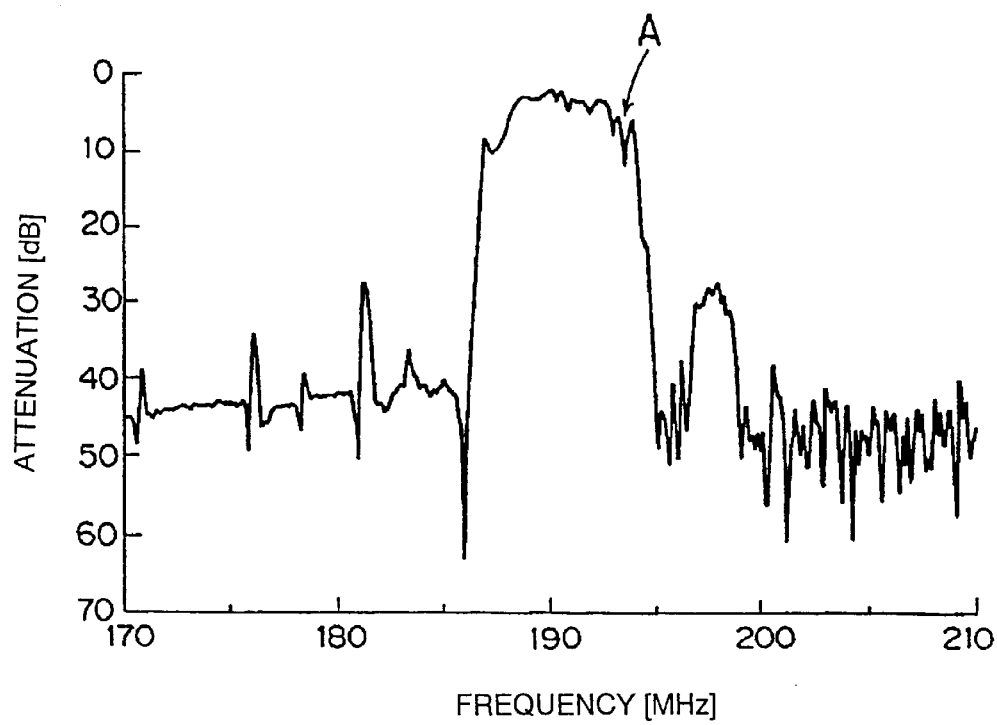
FIG. 2 is a graph showing the attenuation frequency characteristic of a conventional longitudinal surface acoustic wave resonator filter prepared for comparison to preferred embodiments of the present invention.

FIGS. 2 to 5 show the attenuation frequency characteristics of the edge reflection longitudinally coupled type surface acoustic wave resonator filters of the CONVENTIONAL EXAMPLE and EXAMPLES 1 to 3 prepared as described above. That is, FIG. 2 shows the results of the CONVENTIONAL EXAMPLE, FIG. 3 those of EXAMPLE 1, FIG. 4 those of EXAMPLE 2, and FIG. 5 those of EXAMPLE 3.

EXPERIMENTAL EXAMPLE 2

A surface acoustic wave resonator filter 1 into which P ions were implanted was prepared in the same manner as that of EXAMPLE 1. The filter is EXAMPLE 4. The edge surface reflection type longitudinally coupled surface acoustic wave resonator filter was prepared in the same manner as that for EXAMPLE 4 by using a piezoelectric single crystal substrate taken in the same lot was used, except that the ion implantation was not carried out. The filter is CONVENTIONAL EXAMPLE 2.

The peak losses (minimum loss in a pass band) in the attenuation frequency characteristics of the surface acoustic wave resonator filters of the above-described CONVENTIONAL EXAMPLE 2 and EXAMPLE 4 were measured. TABLE 1 shows the results.

Similar to EXAMPLE 4 except that a piezoelectric single crystal substrate taken in another lot was used, by using the P ion implantation, an edge reflection type longitudinally coupled surface acoustic wave resonator filter was prepared as EXAMPLE 5. Further, an edge reflection type longitudinally coupled surface acoustic wave resonator filter as CONVENTIONAL EXAMPLE 3 was produced in the same manner as that for EXAMPLE 5 except that no ions were implanted by using a piezoelectric single crystal substrate taken from the same lot as EXAMPLE 5.

The peak losses of the surface acoustic wave resonator filters of EXAMPLE 5 and CONVENTIONAL EXAMPLE 3 prepared as described above were measured. The results are shown in TABLE 1.

Next, an edge reflection type longitudinally coupled surface acoustic wave resonator filter as EXAMPLE 6 was produced by use of a piezoelectric single crystal substrate into which Ar ions were implanted similar to EXAMPLE 2. Further, an edge reflection type longitudinal surface acoustic wave resonator filter as CONVENTIONAL EXAMPLE 4 was produced to include a piezoelectric single crystal substrate taken from the same lot as that for the edge reflection type longitudinally coupled surface acoustic wave resonator filter of EXAMPLE 6, not carrying out the ion implantation. The peak losses of the surface acoustic wave resonator filters of EXAMPLE 6 and CONVENTIONAL EXAMPLE 4 were measured. The results are shown in TABLE 1.

Further, the edge reflection type longitudinally coupled resonator filters as EXAMPLES 7 and 8 were produced in which B ions were implanted instead of P ions. Moreover, surface acoustic wave resonator filters as CONVENTIONAL EXAMPLES 5 and 6 were prepared by use of piezoelectric single crystal substrates taken from the same lot as that for the surface acoustic wave resonator filters of EXAMPLES 7 and 8, not carrying out ion implantation, respectively. The peak losses of the surface acoustic wave resonator filters of EXAMPLES 7 and 9 and CONVENTIONAL EXAMPLES 5 and 6 were determined, respectively. The results are shown in the following TABLE 1.

TABLE 1

| PEAK LOSS (dB) | | |
|---|---|---|
| CONVENTIONAL EXAMPLE 2<br>3.340 | EXAMPLE 4<br>1.990 | DIFFERENCE<br>−1.350 |
| CONVENTIONAL EXAMPLE 3<br>3.350 | EXAMPLE 5<br>2.020 | DIFFERENCE<br>−1.330 |
| CONVENTIONAL EXAMPLE 4<br>3.490 | EXAMPLE 6<br>1.930 | DIFFERENCE<br>−1.560 |
| CONVENTIONAL EXAMPLE 5<br>3.410 | EXAMPLE 7<br>2.120 | DIFFERENCE<br>−1.290 |
| CONVENTIONAL EXAMPLE 6<br>3.100 | EXAMPLE 8<br>1.860 | DIFFERENCE<br>−1.240 |

As seen in TABLE 1, it is understood that in the case where the edge reflection type longitudinally coupled surface acoustic wave resonator filters were produced by use of the piezoelectric single crystal substrates taken from the same lot, according to preferred embodiments the present invention, the peak loss is decreased as compare with the CONVENTIONAL EXAMPLES including the piezoelectric single crystal substrates taken from the same lot, respectively. In other words, in the case where the piezoelectric single crystal substrate into which ions are implanted, a ripple appearing in the pass band is suppressed and the loss in the pass band is reduced.

Figure 3:
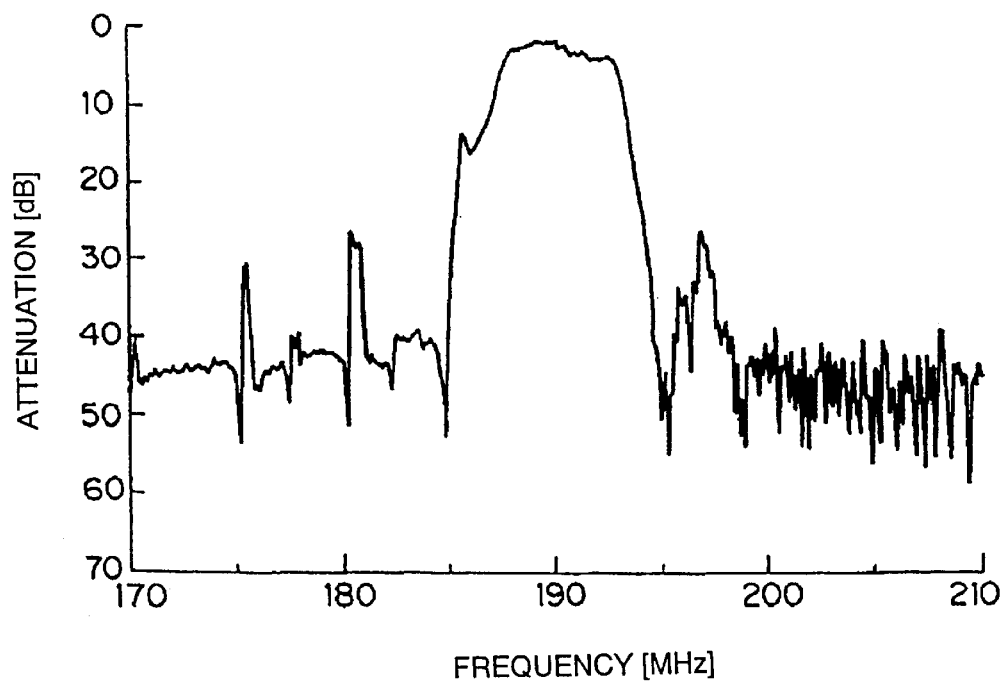
FIG. 3 is a graph showing the attenuation frequency characteristic of an edge reflection type longitudinally coupled surface acoustic wave device of EXAMPLE 1.
Figure 4:
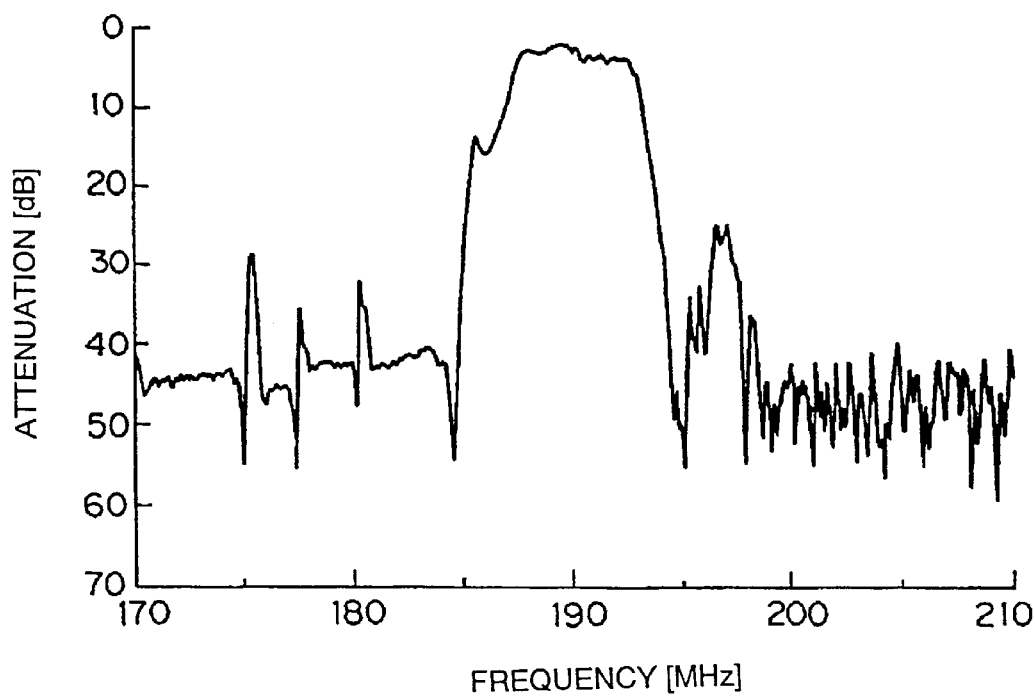
FIG. 4 is a graph showing the attenuation frequency characteristic of an edge reflection type longitudinally coupled surface acoustic wave device according to EXAMPLE 2.
Figure 5:
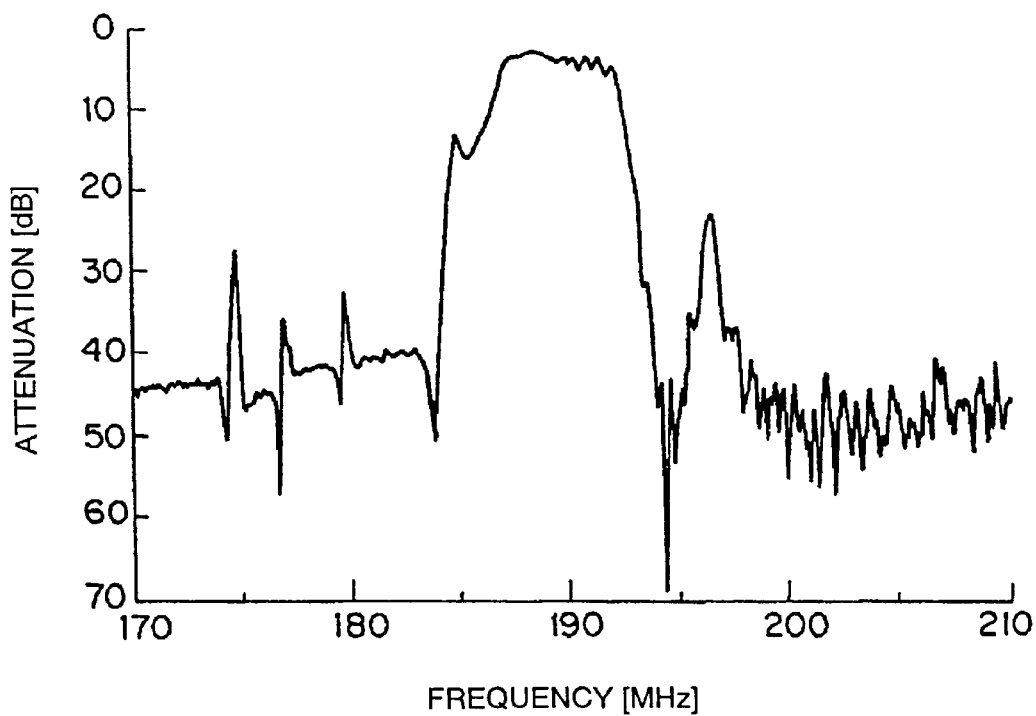
FIG. 5 is a graph showing the attenuation frequency characteristic of the edge reflection type surface acoustic wave device resonator filter of EXAMPLE 3.

As is apparent by comparison of FIG. 2 with FIGS. 3 to 5, in the edge reflection type longitudinal surface acoustic wave resonator filters of the CONVENTIONAL EXAMPLE, a large ripple appears in the pass band as indicated by arrow A. On the other hand, it is understood that in the attenuation frequency characteristics of the respective longitudinally coupled surface acoustic wave resonator filters of EXAMPLES 1 to 3 shown in FIGS. 3 to 5, such a large ripple does not occur in the pass bands, respectively. Especially, in EXAMPLE 1 including the piezoelectric single crystal substrate into which P ions were implanted, it is understood that the ripple in the pass band is remarkably reduced, as shown in FIG. 3.

Accordingly, in the case where an edge reflection type longitudinally coupled surface acoustic wave resonator filter includes a piezoelectric single crystal substrate into which ions are implanted according to preferred embodiments of the present invention, a large ripple appearing in a pass band is prevented from occurring, due to the ion implantation, and the reduction of loss can be realized. Excellent filter characteristics are obtained.

The present invention can be applied not only to the above-described longitudinally coupled surface acoustic wave resonator filter, but widely applied to edge reflection type surface acoustic wave devices which utilize SH type surface acoustic waves. For example, the present invention can be applied to an edge reflection type transverse coupling type surface acoustic wave resonator filter, an edge surface acoustic wave resonator or other similar device. In the case where the present invention is applied to these various types of edge reflection type surface acoustic wave devices, a large ripple is prevented from appearing in a filter characteristic and also in a resonance characteristic by use of the ion-implanted piezoelectric single crystal substrate. As a result, excellent filter characteristics and resonance characteristic are obtained.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. An edge reflection type surface acoustic wave device comprising:
   a surface acoustic wave substrate made of a piezoelectric single crystal and having first and second opposite edges; and
   at least one interdigital transducer provided on the surface acoustic wave substrate and arranged to generate a Shear Horizontal type surface acoustic wave which is reflected between the first and second edges;
   wherein the surface acoustic wave substrate is an ion-implanted piezoelectric single crystal substrate.

2. An edge reflection type surface acoustic wave device according to claim 1, wherein the piezoelectric single crystal substrate is one of a 36° to 41° rotation Y plate LiTaO$_3$, a 41° rotation Y plate LiNbO$_3$, and a 64° rotation Y plate LiNbO$_3$.

3. An edge reflection type surface acoustic wave device according to claim 1, wherein the ions that are implanted include one of Ar ions, N ions, Be ions, B ions, and P ions.

4. An edge reflection type surface acoustic wave device according to claim 1, wherein the ions implanted by ion implantation are P ions.

5. An edge reflection type surface acoustic wave device according to claim 1, wherein the substrate is made of one of LiTaO$_3$ and LiNbO$_3$.

6. An edge reflection type surface acoustic wave device according to claim 1, further comprising a plurality of interdigital electrodes each including electrode fingers.

7. An edge reflection type surface acoustic wave device according to claim 6, wherein a first group of the plurality of electrode fingers have a width of about $\lambda/8$ and a second group of the plurality of electrode fingers have a width of about $\lambda/4$, wherein $\lambda$ represents the wave length of the SH type surface acoustic wave.

8. An edge reflection type surface acoustic wave device according to claim 6, wherein the width of a gap between adjacent electrode fingers in the surface acoustic wave propagation direction is about $\lambda/4$.

9. An edge reflection type surface acoustic wave device according to claim 6, wherein the interdigital electrodes are made of metal.

10. A method of manufacturing an edge reflection type surface acoustic wave device comprising the steps of:
    preparing a surface acoustic wave substrate made of a piezoelectric single crystal;
    implanting ions into the surface of the surface acoustic wave substrate;
    forming at least one interdigital transducer on the surface acoustic wave substrate; and
    cutting the surface acoustic wave substrate in the thickness direction to define a first and second edges.

11. The method according to claim 10, wherein the step of implanting ions into the surface of the surface acoustic wave substrate is carried out by applying an acceleration voltage of about 50 keV to about 150 keV and by applying an ion implantation quantity of about $1 \times 10^4$ ions/cm$^2$ to about $1 \times 10^{16}$ ions/cm$^2$.

12. A method according to claim 10, wherein the piezoelectric single crystal substrate is made of one of a 36° to 41° rotation Y plate LiTaO$_3$, a 41° rotation Y plate LiNbO$_3$, and a 64° rotation Y plate LiNbO$_3$.

13. A method according to claim 10, wherein the ions which are implanted into the piezoelectric single crystal substrate are one of Ar ions, N ions, Be ions, B ions, and P ions.

14. The method according to claim 10, wherein the ions implanted by ion implantation are P ions.

15. The method according to claim 10, wherein the substrate is made of one of LiTaO$_3$ and LiNbO$_3$.

16. The method according to claim 10, further comprising forming a plurality of interdigital electrodes each including electrode fingers on the substrate.

17. The method according to claim 16, wherein a first group of the plurality of electrode fingers have a width of about $\lambda/8$ and a second group of the plurality of electrode fingers have a width of about $\lambda/4$, wherein $\lambda$ represents the wave length of the SH type urace acoustic wave.

18. The method according to claim 16, wherein the width of a gap between adjacent electrode fingers in the surface acoustic wave propagation direction is about $\lambda/4$.

19. The method according to claim 16, wherein the interdigital electrodes are made of metal.

* * * * *